United States Patent [19]

Chen

[11] Patent Number: 5,309,088
[45] Date of Patent: May 3, 1994

[54] MEASUREMENT OF SEMICONDUCTOR PARAMETERS AT CRYOGENIC TEMPERATURES USING A SPRING CONTACT PROBE

[75] Inventor: Men-Chee Chen, Dallas, Tex.

[73] Assignee: Texas Instruments Incorporated, Dallas, Tex.

[21] Appl. No.: 565,581

[22] Filed: Aug. 10, 1990

[51] Int. Cl.[5] .................... G01R 31/26; G01R 31/28
[52] U.S. Cl. ........................... 324/158 D; 324/158 F; 324/158 P
[58] Field of Search ........... 324/158 P, 158 F, 158 D, 324/158 T, 158 R; 357/10, 30; 257/48

[56] References Cited

U.S. PATENT DOCUMENTS

| | | | |
|---|---|---|---|
| 3,710,251 | 1/1973 | Hagge et al. | 324/158 F |
| 4,167,791 | 9/1979 | Banavar et al. | 357/30 |
| 4,177,093 | 12/1979 | Feng et al. | 357/10 |

Primary Examiner—Ernest F. Karlsen
Attorney, Agent, or Firm—Richard A. Stoltz; James C. Kesterson; Richard L. Donaldson

[57] ABSTRACT

A system and method for testing the properties of semiconductor material including an enclosed chamber, a sample of semiconductor material under test having a polished surface portion and insulator layer over the polished surface portion supported in the chamber, a spring probe disposed within the chamber impinging against the insulator layer, a contact disposed on a surface portion of the semiconductor material under test, a pair of contacts disposed external to the chamber, each of the pair of contacts coupled to a different one of the contact and the spring probe and a container supporting the chamber and containing a cryogenic material therein surrounding the chamber. The semiconductor material is preferably a group II-VI composition, preferably HgCdTe. The contact disposed on the surface portion of the semiconductor material is preferably indium. A support, preferably sapphire, is provided for the sample. In a second embodiment, the support for the material under test is controllable for movement in a plane normal to the probe.

6 Claims, 2 Drawing Sheets

MEASUREMENT OF SEMICONDUCTOR PARAMETERS AT CRYOGENIC TEMPERATURES USING A SPRING CONTACT PROBE

BACKGROUND OF THE INVENTION

1. Field of the Invention

This invention relates to a system of measurement of the parameters of semiconductors and preferably group II–VI compositions at cryogenic temperatures.

2. Brief Description of the Prior Art

In some areas of semiconductor material technology, the technology is sufficiently mature such that the properties of the material as grown are known and are repeatable from batch to batch. Accordingly, this as grown material can immediately be utilized in the fabrication of devices without further testing. Silicon is a primary example of such a material.

A problem arises with certain semiconductor materials in that the technology is not presently sufficiently mature to assure repeatability of properties from batch to batch. It is therefore necessary that such semiconductor materials be tested on a batch by batch basis. In the case of the very important metal-insulator semiconductor (MIS) structures, it has been necessary to fabricate the MIS structures themselves prior to running the appropriate parameter tests. Such tests have been, for example, capacitance-voltage (C-V) and conductance-voltage (G-V) measurements in order to study the electrical properties of the material in the steady state and storage time/breakdown voltage measurements in order to study the electrical properties of the material in the non-equilibrium state. Clearly, the requirement to fabricate a device in order to measure and test the properties of the as grown material is laborious, time-consuming and uneconomic.

An attempt to overcome this problem was developed by the use of a mercury contact probe whereby MIS measurements on semiconductors could be made without the actual fabrication of the MIS structures. This is set forth in an article of G. Abowitz et al., Rev. Sci. Instrum., 38, 564 (1967). This probe provides rapid and reliable evaluation of semiconductors at room temperature. Nevertheless, for narrow bandgap semiconductors such as, for example, HgCdTe and InSb, which are operated at cryogenic temperatures, meaningful MIS measurements can only be obtained at such cryogenic temperatures, such as about 77° K, the temperature of liquid nitrogen, where the mercury contact probe no longer functions. Attempts have been made to use a "squeezable gate" approach on HgCdTe at 77° K. This is reported in an article of B. W. Abshere et al. in "Manufacturing Science Program for HgCdTe Detector Array":, section 8, report to U.S. Air Force, Wright Aeronautical Laboratories in 1986. However this approach is limited to one spot and one sample in each experimental run and only capacitance-voltage measurements are demonstrated.

It follows that the prior art is presently unable to measure and test the properties of semiconductor materials for use in MIS devices at cryogenic temperatures without actual initial fabrication of an MIS device for testing.

SUMMARY OF THE INVENTION

In accordance with the present invention, the above described problems of the prior art are minimized or eliminated and there is provided a system for measurement of the properties of semiconductor material at cryogenic temperatures without prior device fabrication. This can be accomplished on individual samples or on plural samples in a single testing run.

Briefly, an as grown semiconductor sample is initially chemo-mechanically polished at a surface thereof in known manner to obtain substantial flatness or planarity at the polished surface region. The as grown and polished sample is then passivated in known manner to grow a thin native oxide passivating layer on the surface thereof having a thickness of about 1200 Angstroms. Potassium hydroxide solution is a preferred passivating material. The sample is then placed on a highly heat conductive support, preferably sapphire, within an optionally hermetically sealable and heat conductive metal container, preferably aluminum, having a removable lid. A contact is formed to the sample, preferably of indium when the sample is HgCdTe. A spring contact probe is disposed in a pin holder which is rigid and capable of withstanding cryogenic temperatures, preferably of Delrin, the probe being placed against the passivating layer with an appropriate force which will not cause damage to the sample. A force of from about $\frac{1}{8}$ to about $\frac{3}{8}$ ounce over a probe tip surface with a diameter of about 0.005 inch has been found to be acceptable in the case of HgCdTe. Conductors are then connected between a contact on the sample, preferably of indium, and a first contact external to the container as well as between the spring probe and a second contact external to the container. The container is then closed and placed in a tray, preferably one of styrofoam, and the temperature external to the tray is lowered to the cryogenic region, preferably by pouring liquid nitrogen into the tray and entirely around the container. The temperature of the sample will thereby be cooled by conduction to the cryogenic temperature, this being (77° K) when liquid nitrogen is used, whereupon parameter testing is then commenced via signals at the contacts external to the container.

The spring contact probe is a probe having a very flat, planar polished bottom surface in order to have a large contact area with the passivated layer over the polished region of the sample. The probe includes a shaft portion which extends into a pin holder with a spring disposed within the holder and providing a force against the probe. Preferably, the probe can apply a force of up to two ounces after travel of about 3 millimeters. The preferred travel distance is from about 0.5 to about 1 millimeter. The polished surface of the probe preferably is rectangular with a dimension of 50 milliinches on each side.

In accordance with a second embodiment of the invention, the support is placed on a programmable x-y translation stage of known type which can be accurately moved. Plural samples of the type described above are placed on the translation stage at known locations thereon. Each sample is then individually tested by movement of the translation stage with concurrent lifting of the probe prior to sample movement. The up and down movement of the probe can be accomplished by another programmable translation stage.

Figure 2A:
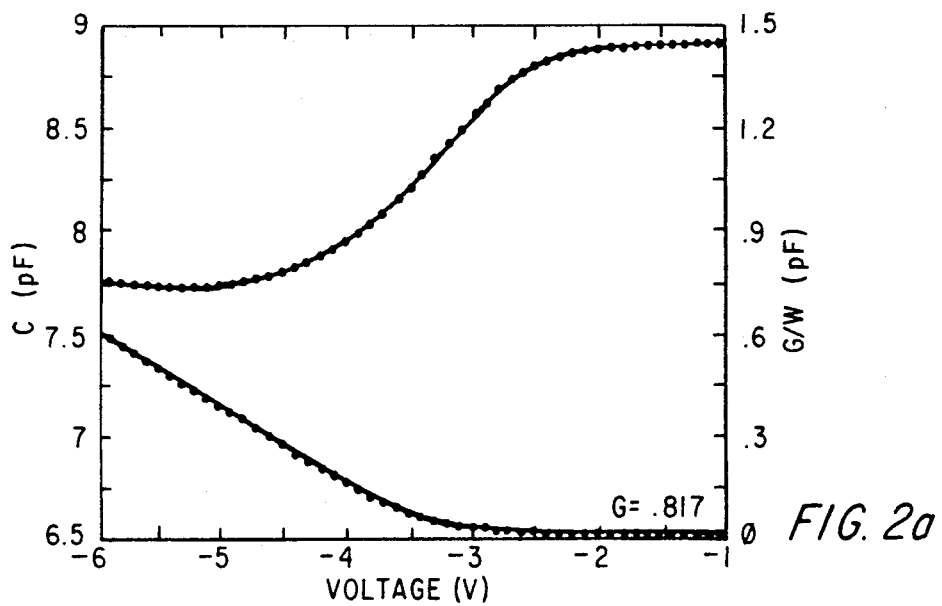
FIG. 2(*a*) is a graph showing quality C-V/G-V curves obtained with high frequency characteristics at 1
Figure 2B:
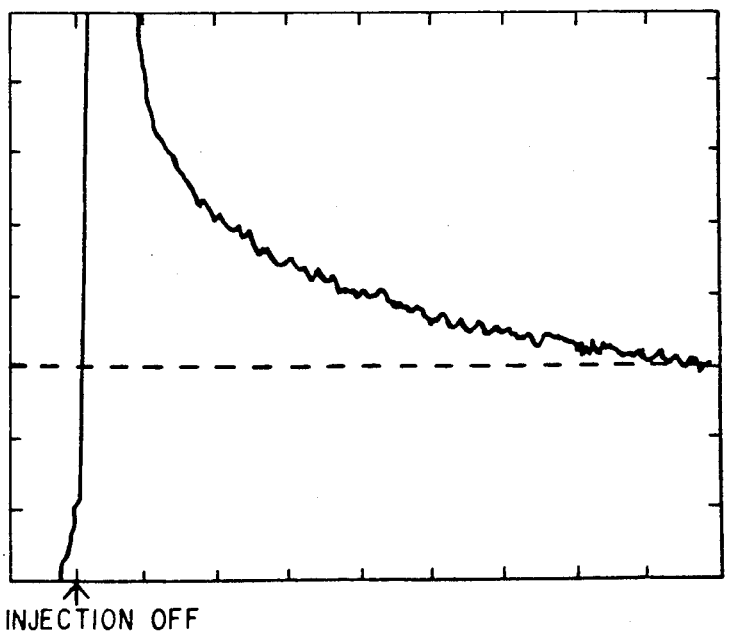
Figure 3:
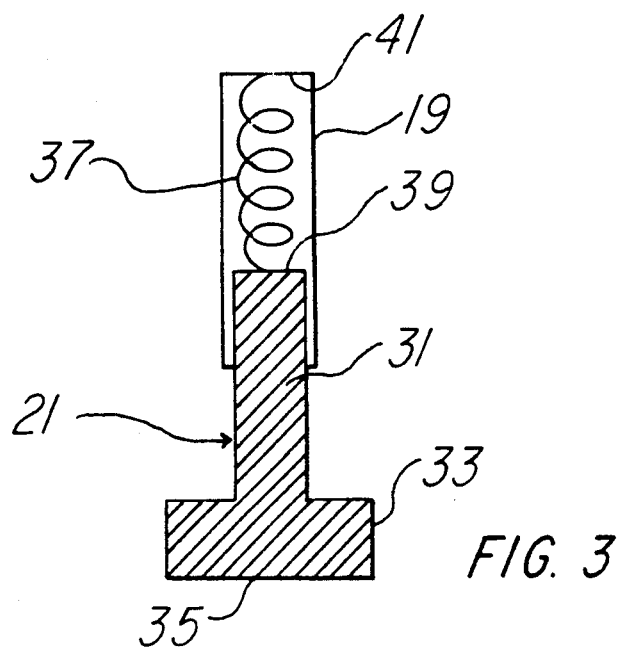
Figure 4:
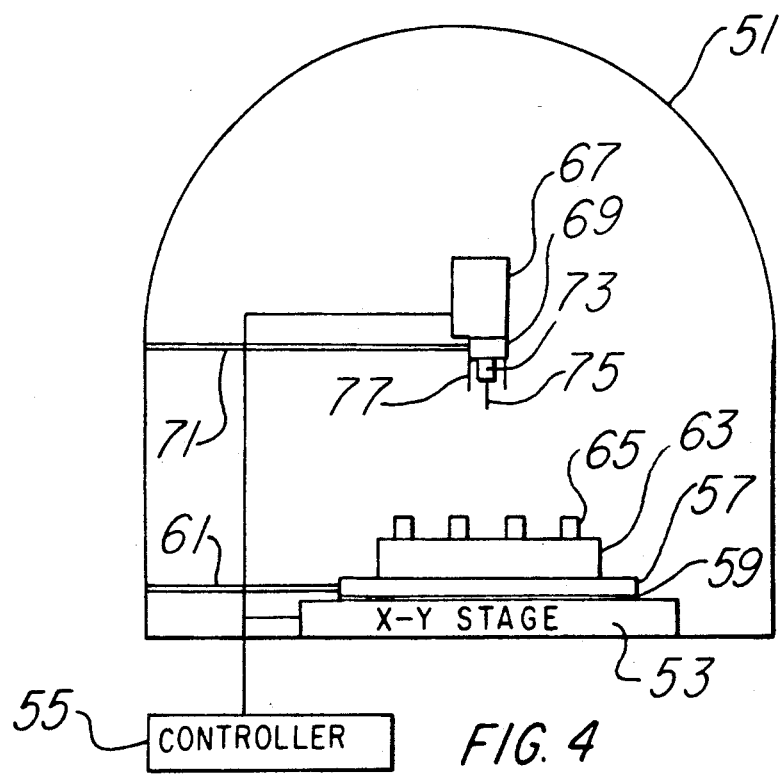

MHz for an n-type HgCdTe sample with a bandgap of about 0.1 eV;

FIG. 2(b) is a graph showing the charge transient curve following an injection pulse whereby storage time and breakdown voltage are measured;

FIG. 3 is a schematic diagram of a probe tip as used in accordance with the present invention; and FIG. 4 is a schematic diagram of a testing system in accordance with a second embodiment of the invention.

DESCRIPTION OF THE PREFERRED EMBODIMENTS

Figure 1:
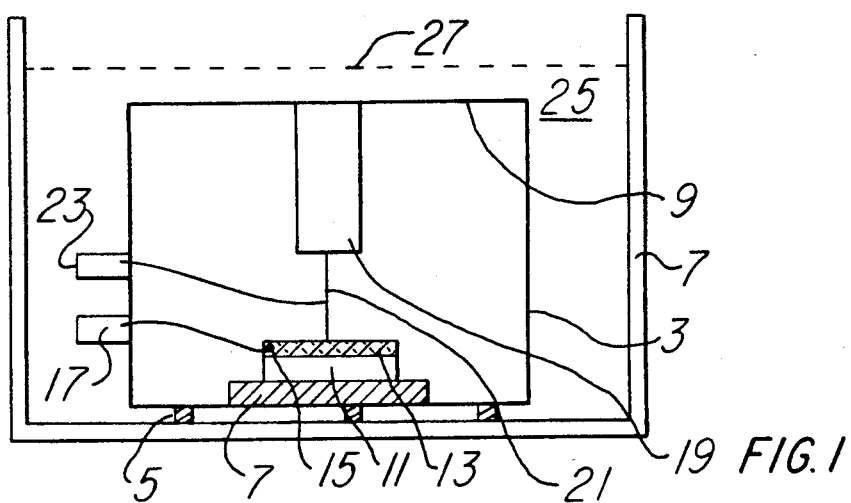
FIG. 1 is a schematic diagram of a testing system in accordance with a first embodiment of the invention.

Referring first to FIG. 1, there is shown a testing system in accordance with a first embodiment of the invention. The system includes a styrofoam tray 1 in the form of a container with an open top. Within the tray 1 is an hermetically sealable Pomona aluminum box 3 having a removable lid 9, the box being spaced on all sides thereof from the interior walls of the tray 1 by spacers 5. A sapphire support or work table 7 is disposed on the bottom interior surface of the box 3. The HgCdTe sample 11 having a highly polished surface portion which has been passivated with a 1200 Angstrom layer of native oxide using a solution of potassium hydroxide 13 is disposed on the support 7. An indium contact 15 is formed on the surface of the sample 11 and in contact with the HgCdTe. The contact 15 is coupled to a contact 17 disposed external to the box 3 and within the tray 1 by a wire extending therebetween. A pin holder 19 of Delrin or other appropriate rigid material capable of operation without breaking under the temperature conditions of liquid nitrogen is secured within the box 3, either to a side wall or to the removable lid 9. A spring probe 21 is spring loaded and extends out of the holder 19, the probe 21 impinging against the oxide layer 13 to form therewith and with the sample portion 11 an MIS device when the lid 9 forms an hermetically sealed enclosure with the remainder of the box 3. The probe 21 is coupled to a contact 23 disposed external to the box 3 and within the tray 1 by a wire extending therebetween. The tray 1 is filled with liquid nitrogen to a level 27 above the box 3 after the box and lid 9 have been optionally hermetically sealed together.

The tray 1 with liquid nitrogen is permitted to stand until the sample has been cooled to a temperature in the vicinity of that of the liquid nitrogen. At this time, test signals are passed through the MIS device formed by way of the contacts 17 and 23 from external signal generating and receiving equipment of standard type (not shown) to provide test results.

It can be seen that for MIS measurements on HgCdTe, only three sample processing steps are required, these being polishing of the sample, anodization of the polished sample and formation of one soldered ohmic contact 15 to the sample. Quality C-V/G-V curves are obtained as shown in FIG. 2(a) where high frequency characteristics at 1 MHz for an n-type HgCdTe sample with a bandgap of about 0.1 eV are indicative of the non-invasive nature of the spring contact probe. FIG. 2(b) shows the charge transient curve following an injection pulse whereby two of the most important device parameters in infrared detectors, namely storage time and breakdown voltage, are measured.

Referring now to FIG. 3, there is shown a schematic diagram of a probe tip as used in accordance with the present invention. The probe tip comprises a Deldrin pin holder 19 having a spring probe 21 having a shaft portion 31 and a contact portion 33 at the end of the shaft portion. The bottommost portion 35 of the contact portion 33 is polished to be as planar as possible so that it will make maximum contact with the polished portion of the sample under test. A spring member 37 is disposed within the pin holder 19 and impinges upon the top surface 39 of the shaft portion 31 and the interior top surface of the holder. The spring force is designed to provide maximum pressure of the portion 35 against the sample under test without damaging the sample. For a HgCdTe sample, the spring 37 is designed to provide 2 ounces of force for a maximum travel of the shaft 31 of 3 mils. The actual travel of the shaft 31 is about 0.5 to about 1 mil. The polished surface 35 is designed to have maximum surface are as well as maximum surface area in contact with the sample under test. By having a larger surface area, the pressure applied to the sample under test per unit area decreases, thereby permitting either a larger total force to be applied or providing equivalent results with lower total force. The surface at the portion 35 preferably will be circular with a diameter of 50 mils. It should be understood, however, that neither these dimensions nor the shape of the probe are critical.

Referring now to FIG. 4, there is shown a second embodiment of the present invention. This embodiment includes a stainless steel bell jar 51 which is evacuated to a pressure of about $1 \times 10^{-6}$ Torr or a pressure sufficiently low to avoid ice formation. Within the bell jar 51 is disposed an x-y stage 53 which is controlled by a controller 55 external to the bell jar. A copper block 57 is disposed over and thermally insulated from the stage 53 by a thermal insulator 59. The copper block 57 is cooled by circulating liquid nitrogen with flexible tubing 61 coupled thereto. A sapphire plate 63 is disposed over the copper block 57 and holds thereon plural samples 65 under test. The samples under test 65 include an insulating layer 13 and a contact 15 thereover as in FIG. 1 with wires extending to a contact 17 external of the bell jar 51. Also, a wire extends from the spring probe 75 to a contacts 23 external of the bell jar as in FIG. 1. A Z-stage 67 controlled by the controller 55 is secured within the bell jar 51 and controls vertical movement of a copper block 69, also cooled by liquid nitrogen via flexible tubing 71. Secured to the block 69 is a pin holder 73 as in FIG. 1 which holds a spring probe 75 a in FIG. 1. A cold shield 77 of aluminum surrounds the spring probe to insulate the samples from the background flux. Movement of the stage 53 in the x-y direction and the spring probe in the z-direction are under control of the controller 55.

It can be seen that there has been provided a testing system which is capable of testing as grown semiconductor material in cryogenic environments without the necessity of fabrication of an MIS device to perform the required tests.

Though the invention has been described with respect to specific preferred embodiments thereof, many variations and modifications will immediately become apparent to those skilled in the art. I is therefore the intention that the appended claims be interpreted as broadly as possible in view of the prior art to include al such variations and modifications.

I claim:

1. A method for determining the properties of semiconductor material which includes the steps of:

(a) providing an enclosed chamber;

(b) providing a sample of as-grown semiconductor material;

(c) polishing a surface portion of said semiconductor material;

(d) providing an insulator layer over said polished surface portion;

(e) supporting said sample of (d) in said chamber;

(f) impinging a spring probe disposed within said chamber against said insulator layer with a predetermined force, said spring probe, to provide and MIS device with said insulator layer and semiconductor material;

(g) providing a first contact contacting a surface portion of said semiconductor material under test;

(h) providing a pair of contact elements disposed external to said chamber, each of said pair of contacts coupled to a different one of said first contact and said spring probe for injecting a signal into said sample and receiving an output therefrom responsive to said injecting a signal; and (i) supporting said chamber in a cryogenic material surrounding said chamber.

2. A method as set forth in claim 1 wherein said semiconductor material is a group II–VI composition.

3. A method as set forth in claim 1 wherein said semiconductor material is HgCdTe.

4. The method of claim 1 wherein said cryogenic temperature is about the temperature of liquid nitrogen.

5. The method of claim 1 wherein said step of cooling said semiconductor material to a cryogenic temperature comprises the step of supporting said chamber in a cryogenic material.

6. The method of claim 4 wherein said step of cooling said semiconductor material to a cryogenic temperature comprises the step of supporting said chamber in a cryogenic material.

* * * * *